(12) United States Patent
Nakayama et al.

(10) Patent No.: US 7,519,509 B2
(45) Date of Patent: Apr. 14, 2009

(54) NETWORK ANALYZER, TRANSMISSION TRACKING ERROR MEASURING METHOD, NETWORK ANALYZING METHOD, PROGRAM, AND RECORDING MEDIUM

(75) Inventors: Yoshikazu Nakayama, Saitama (JP); Masato Haruta, Saitama (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 10/599,124

(22) PCT Filed: Mar. 15, 2005

(86) PCT No.: PCT/JP2005/005066

§ 371 (c)(1),
(2), (4) Date: May 18, 2007

(87) PCT Pub. No.: WO2005/093438

PCT Pub. Date: Oct. 6, 2005

(65) Prior Publication Data

US 2007/0285108 A1    Dec. 13, 2007

(30) Foreign Application Priority Data

Mar. 26, 2004    (JP)    ............... 2004-092296

(51) Int. Cl.
*G06F 11/30*     (2006.01)
*G21C 17/00*     (2006.01)

(52) U.S. Cl. ................ 702/185; 702/57; 702/69; 324/601; 324/638

(58) Field of Classification Search ............ 702/106, 702/107, 57–59, 66, 67, 69, 75, 70, 73, 74, 702/108, 117, 118, 120, 124, 126, 183, 189; 375/224–226

See application file for complete search history.

(56) References Cited

U.S. PATENT DOCUMENTS 4,550,407 A  *  10/1985  Couasnon et al. .............. 714/39

(Continued)

FOREIGN PATENT DOCUMENTS

JP          11-038054          2/1999

(Continued)

OTHER PUBLICATIONS

English Language Abstract of JP 11-118853.

(Continued)

*Primary Examiner*—Eliseo Ramos Feliciano
*Assistant Examiner*—Mi'schita' Henson
(74) *Attorney, Agent, or Firm*—Greenblum & Bernstein, P.L.C.

(57)    ABSTRACT

There is reduced labor to directly connect two ports selected from ports of a network analyzer in order to measure transmission tracking errors. A network analyzer, to which a test set which branches four ports to nine ports (main port group: three ports, and sub port groups: three ports ×2) is connected, includes transmission/reception ports, a transmission tracking error determining unit which determines transmission tracking errors of a combination of one of possible connections in the main port group and one of possible connections in the sub port groups for all the possible connections in the main port group based on signals before transmitted by the transmission/reception ports and reception signals, and a transmission tracking error deriving unit which derives other transmission tracking errors based on the transmission tracking errors determined by the transmission tracking error determining unit.

12 Claims, 20 Drawing Sheets

U.S. PATENT DOCUMENTS

| | | | |
|---|---|---|---|
| 5,578,932 A * | 11/1996 | Adamian | 324/601 |
| 5,661,404 A * | 8/1997 | Yanagawa et al. | 324/601 |
| 5,793,213 A * | 8/1998 | Bockelman et al. | 324/601 |
| 6,081,125 A * | 6/2000 | Krekels et al. | 324/601 |
| 6,147,501 A | 11/2000 | Chodora | |
| 2003/0101387 A1 * | 5/2003 | Lee | 714/704 |
| 2006/0005065 A1 | 1/2006 | Nakayama et al. | |

FOREIGN PATENT DOCUMENTS

| | | |
|---|---|---|
| JP | 11-118853 | 4/1999 |
| JP | 11-183535 | 7/1999 |
| WO | 03/087856 | 10/2003 |

OTHER PUBLICATIONS

English Language Abstract of JP 11-183535.

English Language Abstract of JP 11-038054.

U.S. Appl. No. 10/598,201 to Nakayama et al., filed Aug. 21, 2006.

* cited by examiner

| Connection | Name of Port | | | | | | | | |
|---|---|---|---|---|---|---|---|---|---|
| | TP1 | TP2 | TP3 | TP4 | TP5 | TP6 | TP7 | TP8 | TP9 |
| A | A1 | A2 | — | A3 | — | — | A4 | — | — |
| B | B1 | — | B2 | — | B3 | — | — | B4 | — |
| C | — | C1 | C2 | — | — | C3 | — | — | C4 |

NETWORK ANALYZER, TRANSMISSION TRACKING ERROR MEASURING METHOD, NETWORK ANALYZING METHOD, PROGRAM, AND RECORDING MEDIUM

TECHNICAL FIELD

The present invention relates to a network analyzer used to calculate and measure circuit parameters of a device under test.

BACKGROUND ART

There has conventionally been practiced measurement of circuit parameters (such as the S parameters) of a device under test (DUT). A description will now be given of the measurement method of the circuit parameters of the device under test (DUT) according to the prior art with reference to FIG. 18.

A signal at frequency f1 is transmitted from a signal source 110 to a receiving unit 120 via a DUT 200. The signal is received by the receiving unit 120. It is assumed that the frequency of the signal received by the receiving unit 120 is f2. It is possible to acquire the S parameters and frequency characteristics of the DUT 200 by measuring the signal received by the receiving unit 120.

On this occasion, measuring system errors are generated in the measurement due to mismatching between a measuring system such as the signal source 110 and the DUT 200, and the like These measuring system errors include, for example, Ed: error caused by the direction of a bridge, Er: error caused by frequency tracking, and Es: error caused by source matching. FIG. 19 shows a signal flow graph relating to the signal source 110 if the frequency f1=f2. RF IN denotes a signal input from the signal source 110 to the DUT 200 or the like, S1im denotes an S parameter of the DUT 200 and the like acquired by a signal reflected from the DUT 200 or the like, and S11a denotes a true S parameter of the DUT 200 and the like without measuring system errors.

If the frequency f1=f2, the errors can be corrected in a manner described in a patent document 1 (Japanese Laid-Open Patent Publication (Kokai) No. H11-38054), for example. The correction in this way is referred to as calibration. A brief description will now be given of the calibration. Calibration kits are connected to the signal source 110 to realize three types of state: open, short circuit, and load (standard load Z0). In these states, a signal reflected from the respective calibration kits is acquired by a bridge to obtain three types of the S parameter (S11m) corresponding to the three types of state. The three types of variable Ed, Er, and Es are acquired from the three types of the S parameter.

However, the frequency f1 may not be equal to the frequency f2. For example, the DUT 200 may be a device providing a frequency conversion function such as a mixer. In this case, a measuring system error caused by the receiving unit 120 cannot be neglected. FIG. 20 shows a signal flow graph if the signal source 110 and the receiving unit 120 are directly connected with each other. S21m denotes an S parameter of the DUT 200 and the like acquired based on a signal received by the receiving unit 120. As shown in FIG. 20, there are generated measuring system errors Et (transmission tracking error) and EL caused by the receiving unit 120. These errors cannot be acquired by the calibration as described in the patent document 1.

Therefore, if the frequency f1 is not equal to the frequency f2, the errors are corrected as described in a patent document 2 (WO 03/087856, pamphlet). First, three types of calibration kit (open, short circuit, and load (standard load Z0)) are connected to a signal source This is the same as the method described in the patent document 1, and Ed, Es, and Er can thus be acquired. Further, a signal source 110 and a receiving unit 120 are directly connected with each other, and the transmission tracking errors Et and EL can be acquired based on a measured result on this occasion (refer to FIG. 8 and FIG. 9 in the patent document 2).

It should be noted that the above example is applied to a case where a network analyzer including the signal source 110 and the receiving unit 120 has two ports. If a network analyzer has four ports, two ports are selected from the four ports, and are directly connected with each other, and it is thus necessary to carry out a total of 4×3/2=6 couplings. In general, if a network analyzer has n ports, two ports are selected from the n ports, and are directly connected with each other, and it is thus necessary to carry out a total of n×(n−1)/2 couplings.

However, a large amount of labor is necessary to realize all combinations of two ports by selecting and directly connecting two ports out of the n ports as described above.

An object of the present invention is to reduce the labor required to select and directly connect two ports out of ports of a network analyzer in order to measure transmission tracking errors.

DISCLOSURE OF THE INVENTION

An aspect of the present invention is a network analyzer that is connected to a test set that includes network analyzer side ports, device under test side ports that are connected to a device under test, and a port connecting unit that selects any one of the device under test side ports, and connects the selected device under test side port to one of the network analyzer side ports, wherein the device under test side ports constitute a main port group and a sub port group whose connection to the network analyzer side ports is independently set, the network analyzer including: transmission/reception ports that are connected to the network analyzer side ports one by one, and are used to transmit/receive a signal; a transmission tracking error determining unit that determines a transmission tracking error of a combination of one of the possible connections of the main port group and one of the possible connections of the sub port group for au the possible connections of the main port group based on a signal before transmitted by the transmission/reception port, and a reception signal; and a transmission tracking error deriving unit that derives a transmission tracking error other than the transmission tracking errors determined by the transmission tracking error determining unit based on the transmission tracking error determined by the transmission tracking error determining unit.

According to the thus constructed invention, a network analyzer that is connected to a test set that includes network analyzer side ports, device under test side ports that axe connected to a device under test, and a port connecting unit that selects any one of the device under test side ports, and connects the selected device under test side port to one of the network analyzer side ports, wherein the device under test side ports constitute a main port group and a sub port group whose connection to the network analyzer side ports is independently set, is provided.

Transmission/reception ports are connected to the network analyzer side ports one by one, and are used to transmit/receive a signal. A transmission tracking error determining unit determines a transmission tracking error of a combination of one of the possible connections of the main port group and one of the possible connections of the sub port group for all the possible connections of the main port group based on a signal before transmitted by the transmission/reception port, and a reception signal. A transmission tracking error deriving unit derives a transmission tracking error other than the transmission tracking errors determined by the transmission tracking error determining unit based on the transmission tracking error determined by the transmission tracking error determining unit.

According to the present invention, the transmission tracking error deriving unit may use two connections other than connections at a start point and an endpoint of the transmission tracking error to be derived to derive the transmission tracking error for a combination of one of the possible connections of the main port group and another possible connection of the sub port group.

According to the present invention, the main port group may include three of the device under test side ports connected to two of the network analyzer side ports; the sub port group may include three of the device under test side ports connected to one of the network analyzer side ports; and two of the sub port groups may exist.

According to the present invention, the network analyzer may includes a transmission signal measuring unit that measures a transmission signal parameter relating to a transmission signal transmitted from the transmission/reception port before a measuring system error factor is generated; and a reception signal measuring unit that measures a reception signal parameter relating to a reception signal received by the transmission/reception port.

According to the present invention, the reception signal may include a reflected signal which is a reflected transmission signal.

Another aspect of the present invention is a transmission tracking error measuring method of measuring a transmission tracking error of a network analyzer that is connected to a test set that includes network analyzer side ports, device under test side ports that are connected to a device under test, and a port connecting unit that selects any one of the device under test side ports, and connects the selected device under test side port to one of the network analyzer side ports, wherein the device under test side ports constitute a main port group and a sub port group whose connection to the network analyzer side ports is independently set, the network analyzer including transmission/reception ports that are connected to the network analyzer side ports one by one, and are used to transmit/receive a signal, the transmission tracking error measuring method including: a connection realizing step of realizing a combination of one of the possible connections of the main port group and one of the possible connections of the sub port group for all the possible connections of the main port group; a device under test side port coupling step of realizing all couplings for one combination of two ports for the device tinder test side ports connected to the network analyzer side ports if the combination is realized by the connection realizing step; a signal measuring step of measuring a signal before transmitted by the transmission/reception port, and a received signal; a transmission tracking error determining step of determining a transmission tracking error of the coupling realized by the device under test side port coupling step based on a measured result of the signal measuring step; and a transmission tracking error deriving step of deriving a transmission tracking error other than the transmission tracking error determined by the transmission tracking error determining step based on the transmission tracking error determined by the transmission tracking error determining step.

According to the thus constructed invention, a transmission tracking error measuring method of measuring a transmission tracking error of a network analyzer that is connected to a test set that includes network analyzer side ports, device under test side ports that are connected to a device under test, and a port connecting unit that selects any one of the device under test side ports, and connects the selected device under test side port to one of the network analyzer side ports, wherein the device under test side ports constitute a main port group and a sub port group whose connection to the network analyzer side ports is independently set, is provided.

The network analyzer includes transmission/reception ports that are connected to the network analyzer side ports one by one, and are used to transmit/receive a signal.

A connection realizing step realizes a combination of one of the possible connections of the main port group and one of the possible connections of the sub port group for all the possible connections of the main port group. A device under test side port coupling step realizes all couplings for one combination of two ports for the device under test side ports connected to the network analyzer side ports if the combination is realized by the connection realizing step. A signal measuring step measures a signal before transmitted by the transmission/reception port, and a received signal. A transmission tracking error determining step determines a transmission tracking error of the coupling realized by the device under test side port coupling step based on a measured result of the signal measuring step. A transmission tracking error deriving step derives a transmission tracking error other than the transmission tracking error determined by the transmission tracking error determining step based on the transmission tracking error determined by the transmission tracking error determining step.

According to an aspect of the present invention, the device under test side port coupling step may be realized by a four-port calibrator which can couple all combinations of two ports out of four ports.

Another aspect of the present invention is a network analyzing method of analyzing the net work by using a network analyzer that is connected to a test set that includes network analyzer side ports, device under test side ports that are connected to a device under test, and a port connecting unit that selects any one of the device under test side ports, and connects the selected device under test side port to one of the network analyzer side ports, wherein the device under test side ports constitute a main port group and a sub port group whose connection to the network analyzer side ports is independently set, the network analyzer including: transmission/reception ports that are connected to the network analyzer side ports one by one, and are used to transmit/receive a signal; the network analyzing method including: a transmission tracking error determining step that determines a transmission tracking error of a combination of one of the possible connections of the main port group and one of the possible connections of the sub port group for all the possible connections of the main port group based on a signal before transmitted by the transmission/reception port, and a reception signal; and a transmission tracking error deriving step that derives a transmission tracking error other than the transmission tracking errors determined by the transmission tracking error determining step based on the transmission tracking error determined by the transmission tracking error determining step.

Another aspect of the present invention is a program of instructions for execution by the computer to perform a processing for analyzing a network by using a network analyzer that is connected to a test set that includes network analyzer side ports, device under test side ports that axe connected to a device under test, and a port connecting unit that selects any one of the device under test side ports, and connects the selected device under test side port to one of the network analyzer side ports, wherein the device under test side ports constitute a main port group and a sub port group whose connection to the network analyzer side ports is independently set, the network analyzer including: transmission/reception ports that are connected to the network analyzer side ports one by one, and are used to transmit/receive a signal; the processing including: a transmission tracking error determining step that determines a transmission tracking error of a combination of one of the possible connections of the main port group and one of the possible connections of the sub port group for all the possible connections of the main port group based on a signal before transmitted by the transmission/reception port, and a reception signal; and a transmission tracking error deriving step that derives a transmission tracking error other than the transmission tracking errors determined by the transmission tracking error determining step based on the transmission tracking error determined by the transmission tracking error determining step.

Another aspect of the present invention is a computer-readable medium having a program of instructions for execution by the computer to perform a processing for analyzing a network by using a network analyzer that is connected to a test set that includes network analyzer side ports, device under test side ports that are connected to a device under test, and a port connecting unit that selects any one of the device under test side ports, and connects the selected device under test side port to one of the network analyzer side ports, wherein the device under test side ports constitute a main port group and a sub port group whose connection to the network analyzer side ports is independently set, the network analyzer including: transmission/reception ports that are connected to the network analyzer side ports one by one, and are used to transmit/receive a signal; the processing including: a transmission tracking error determining step that determines a transmission tracking error of a combination of one of the possible connections of the main port group and one of the possible connections of the sub port group for all the possible connections of the main port group based on a signal before transmitted by the transmission/reception port, and a reception signal; and a transmission tracking error deriving step that derives a transmission tracking error other than the transmission tracking errors determined by the transmission tracking error determining step based on the transmission tracking error determined by the transmission tracking error determining step.

BRIEF DESCRIPTION OF THE DRAWINGS

FIG. 4 shows possible states of the connections which represent which network analyzer side ports are respectively connected to which DUT side ports on this occasion;

FIG. 5 is a block diagram showing a configuration of the four-port calibrator 30;

FIG. 9 is a block diagram showing a configuration of the sub calibrator 34a;

FIG. 11 is a signal flow graph showing a state where a calibration port 32a is connected to the sub calibrator 34a;

BEST MODE FOR CARRYING OUT THE INVENTION

A description will now be given of an embodiment of the present invention with reference to drawings.

Figure 1:
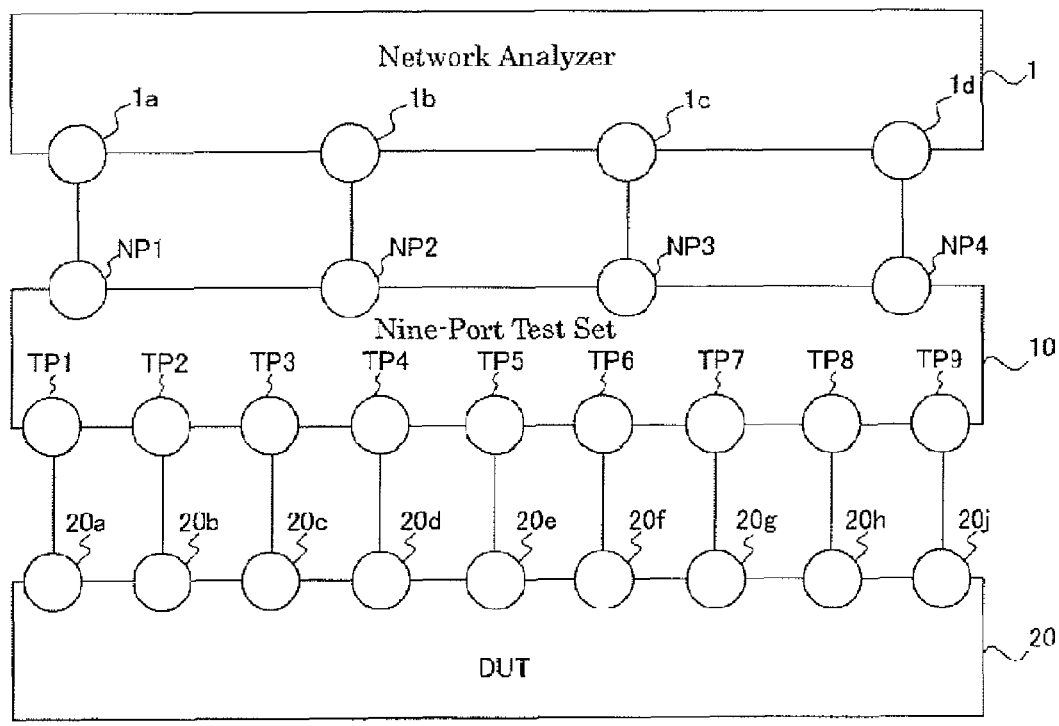
FIG. 1 is a diagram showing a configuration of a measuring system in which a network analyzer 1 according to an embodiment of the present invention is used.

FIG. 1 is a diagram showing a configuration of a measuring system in which a network analyzer 1 according to an embodiment of the present invention is used. The measuring system includes a network analyzer 1, a nine-port test set 10, and a DUT 20.

The network analyzer 1 includes transmission/reception ports 1a, 1b, 1c, and 1d. The nine-port test set 10 includes network analyzer side ports NP1, NP2, NP3, and NP4, and DUT side ports TP1, TP2, TP3, TP4, TP5, TP6, TP7, PT8, and TP9. The DUT (Device Under Test) 20 includes ports 20a, 20b, 20c, 20d, 20e, 20f, 20g, 20h, and 20j.

The transmission/reception port 1a is connected to the network analyzer side port NP1. The transmission/reception port 1b is connected to the network analyzer side port NP2. The transmission/reception port 1c is connected to the network analyzer side port NP3. The transmission/reception port 1d is connected to the network analyzer side port NP4. The transmission/reception ports 1a, 1b, 1c, and 1d are ports used to transmit/receive a signal.

The DUT side port TP1 is connected to the port 20a. The DUT side port TP2 is connected to the port 20b. The DUT side port TP3 is connected to the port 20c. The DUT side port TP4 is connected to the port 20d. The DUT side port TP5 is connected to the port 20e. The DUT side port TP6 is connected to the port 20f. The DUT side port TP7 is connected to the port 20g. The DUT side port TP8 is connected to the port 20h. The DUT side port TP9 is connected to the port 20j.

Figure 2:
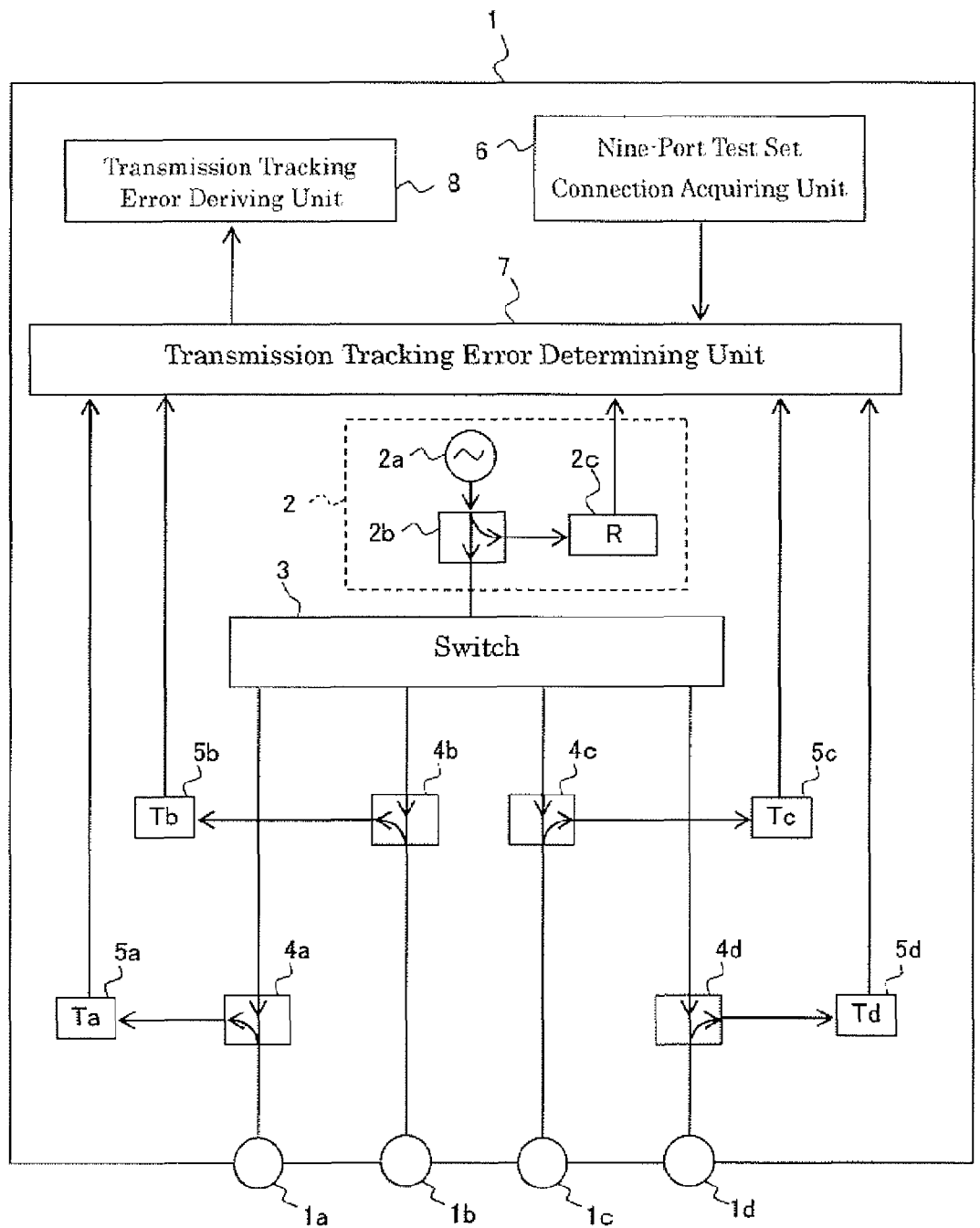
FIG. 2 is a block diagram showing a configuration of the network analyzer 1 according to the embodiment of the present invention.

FIG. 2 is a block diagram showing a configuration of the network analyzer 1 according to the embodiment of the present invention. The network analyzer 1 includes the transmission/reception ports 1a, 1b, 1c, and 1d, a signal source 2, a switch 3, bridges 4a, 4b, 4c, and 4d, receivers (reception signal measuring means) 5a, 5b, 5c, and 5d, a nine-port test set connection acquiring unit 6, a transmission tracking error determining unit 7, and a transmission tracking error deriving unit 8. The network analyzer 1 measures characteristics of the DUT 20 based on signals transmitted/received by the transmission/reception ports 1a, 1b, 1c, and 1d.

The signal source 2 includes a signal output unit 2a, a bridge 2b, and a receiver (R) 2c (transmission signal measuring means).

The signal output unit 2a outputs a signal at a predetermined frequency. This signal is a transmission signal transmitted from any one of the transmission/reception ports 1a, 1b, 1c, and 1d.

The bridge 2b supplies the receiver (R) 2c and the switch 3 with the transmission signal output from the signal output unit 2a. The signal supplied by the bridge 2b is a signal which has not been influenced by measuring system error factors caused by the network analyzer 1.

The receiver (R) 2c (transmission signal measuring means) measures S parameters of the signal received from the bridge 2b. The receiver (R) 2c thus measures S parameters (transmission signal parameters) relating to the transmission signal before there arises an influence of the measuring system error factors due to the network analyzer 1.

The switch 3 supplies any one of the bridges 4a, 4b, 4c, and 4d with the transmission signal supplied by the signal source 2.

The bridge 4a outputs the transmission signal supplied from the signal source 2 to the transmission/reception port 1a. Moreover, the bridge 4a receives a reception signal received by the transmission/reception port 1a, and outputs the reception signal to the receiver 5a. The reception signal is a transmission signal transmitted by any of the transmission/reception ports 1b, 1e, and 1d, and received by the transmission/reception port 1a. It should be noted that the transmission signal which is transmitted from the transmission/reception port 1a, is reflected, and is received by the transmission/reception port 1a (reflected signal) is also a reception signal.

It should be noted that the transmission/reception port 1a and any of the transmission/reception ports 1b, 1e, and 1d are connected to the DUT 20 or a four-port calibrator 30 described later. A transmission signal transmitted by any of the transmission/reception ports 1b, 1c, and 1d is thus received by the transmission/reception port 1a. Moreover, a transmission signal transmitted from the transmission/reception port 1a is reflected by the DUT 20, the nine-port test set 10, or a four-port calibrator 30, which is described later, and is received by the transmission/reception port 1a.

The bridge 4b outputs the transmission signal supplied from the signal source 2 to the transmission/reception port 1b. Moreover, the bridge 4b receives a reception signal received by the transmission/reception port 1b, and outputs the reception signal to the receiver 5b. The reception signal is a transmission signal transmitted by any one of the transmission/reception ports 1a, 1c, and 1d, and received by the transmission/reception port 1b. It should be noted that the transmission signal which is transmitted by the transmission/reception port 1b, is reflected, and is received by the transmission/reception port 1b (reflected signal) is also a reception signal.

It should be noted that the transmission/reception port 1b and any of the transmission/reception ports 1a, 1c, and 1d are connected by the DUT 20 or the four-port calibrator 30 described later. A transmission signal transmitted by any of the transmission/reception ports 1a, 1c, and 1d is thus received by the transmission/reception port 1b. Moreover, a transmission signal transmitted from the transmission/reception port 1b is reflected by the DUT 20, the nine-port test set 10, or the four-port calibrator 30, which is described later, and is received by the transmission/reception port 1b.

The bridge 4c outputs the transmission signal supplied from the signal source 2 to the transmission/reception port 1c. Moreover, the bridge 4c receives a reception signal received by the transmission/reception port 1c, and outputs the reception signal to the receiver 5c. The reception signal is a transmission signal transmitted by any of the transmission/reception ports 1a, 1b, and 1d, and received by the transmission/reception port 1c. It should be noted that the transmission signal which is transmitted by the transmission/reception port 1c, is reflected, and is received by the transmission/reception port 1c (reflected signal) is also a reception signal.

It should be noted that the transmission/reception port 1c and any of the transmission/reception ports 1a, 1b, and 1d are connected by the DUT 20 or the four-port calibrator 30 described later A transmission signal transmitted by any of the transmission/reception ports 1a, 1b, and 1d is thus received by the transmission/reception port 1c. Moreover, a transmission signal transmitted from the transmission/reception port 1c is reflected by the DUT 20, the nine-port test set 10, or the four-port calibrator 30, which is described later, and is received by the transmission/reception port 1c.

The bridge 4d outputs the transmission signal supplied from the signal source 2 to the transmission/reception port 1d. Moreover the bridge 4d receives a reception signal received by the transmission/reception port 1d, and outputs the reception signal to the receiver 5d. The reception signal is a transmission signal transmitted by any of the transmission/reception ports 1a, 1b, and 1c, and received by the transmission/reception port 1d. It should be noted that the transmission signal which is transmitted by the transmission/reception port 1d, is reflected, and is received by the transmission/reception port 1d (reflected signal) is also a reception signal.

It should be noted that the transmission/reception port 1d and any of the transmission/reception ports 1a, 1b, and 1c are connected by the DUT 20 or the four-port calibrator 30 described later. A transmission signal transmitted by any of the transmission/reception ports 1a, 1b, and 1c is thus received by the transmission/reception port 1d. Moreover, a transmission signal transmitted from the transmission/reception port 1d is reflected by the DUT 20, the nine-port test set 10, or the four-port calibrator 30, which is described later, and is received by the transmission/reception port 1d.

The receiver (reception signal measuring means) 5a measures S parameters of the signal received from the bridge 4a. The receiver (Ta) 5a thus measures S parameters relating to the reception signal (reception signal parameters) received by the transmission/reception port 1a.

The receiver (reception signal measuring means) 5b measures S parameters of the signal received from the bridge 4b. The receiver (Tb) 5b thus measures S parameters relating to the reception signal (reception signal parameters) received by the transmission/reception port 1b.

The receiver (reception signal measuring means) 5c measures S parameters of the signal received from the bridge 4c. The receiver (Tc) 5c thus measures S parameters relating to the reception signal (reception signal parameters) received by the transmission/reception port 1c.

The receiver reception signal measuring means) 5d measures S parameters of the signal received from the budge 4d.

The receiver (Td) 5d thus measures S parameters relating to the reception signal (reception signal parameters) received by the transmission/reception port 1d.

The nine-port test set connection acquiring unit 6 acquires which network analyzer side ports are respectively connected to which DUT side ports (referred to as connections), and provides the transmission tracking error determining unit 7 with the acquired connections. The connections may be provided by a user, for example. The nine-port test set connection acquiring unit 6 may be connected to the nine-port test set 10, and the connections of the nine-port test set 10 may be supplied to the nine-port test set connection acquiring unit 6 as a signal.

The transmission tracking error determining unit 7 receives the measured results from the receiver (R) 2c, and the receivers 5a, 5b, 5c, and 5d, and determines transmission tracking errors. To which connection the transmission tracking errors respectively relate to is determined by the connections provided by the nine-port test set connection acquiring unit 6.

The transmission tracking error deriving unit 8 derives transmission tracking errors other than the transmission tracking errors determined by the transmission tracking error determining unit 7 based on the transmission tracking errors determined by the transmission tracking error determining unit 7.

Figure 3:
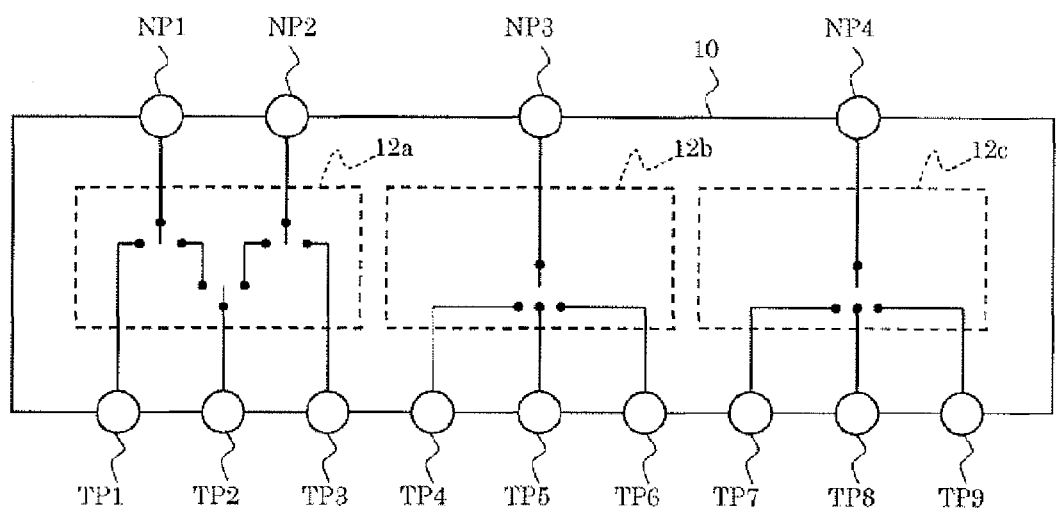
FIG. 3 shows a configuration of the nine-port test set 10.

FIG. 3 shows a configuration of the nine-port test set 10. The nine-port test set 10 includes port connecting units 12a, 12b, and 12c, the network analyzer side ports NP1, NP2, NP3, and NP4, and the DUT side ports TP1, TP2, TP3, TP4, TP5, TP6, TP7, PT8, and TP9.

The port connecting unit 12a selects either one of the DUT side ports TP1 and TP2, and connects the selected DUT side port to the network analyzer side port NP1. The port connecting unit 12a further selects either one of the DUT side ports TP2 and TP3, and connects the selected DUT side port to the network analyzer side port NP2. It should be noted that if the network analyzer side port NP1 is connected to the DUT side port TP2, the DUT side port TP2 is not connected to the network analyzer side port NP2. If the network analyzer side port NP2 is connected to the DUT side port TP2, the DUT side port TP1 is not connected to the network analyzer side port NP2.

The port connecting unit 12b selects any one of the DUT side ports TP4, TP5, and TP6, and connects the selected DUT side port to the network analyzer side port NP3.

The port connecting unit 12c selects any one of the DUT side ports TP7, TP8, and TP9, and connects the selected DUT side port to the network analyzer side port NP4.

FIG. 4 shows possible states of the connections which represent which network analyzer side ports are respectively connected to which DUT side ports on this occasion.

In a connection A, the DUT side port TP1 is connected to the network analyzer side port NP1. The DUT side port TP2 is connected to the network analyzer side port NP2. The DUT side port TP4 is connected to the network analyzer side port NP3. The DUT side port TP7 is connected to the network analyzer side port NP4.

This connection is denoted by A1 for the DUT side port TP1. This connection is denoted by A2 for the DUT side port TP2. This connection is denoted by A3 for the DUT side port TP4. This connection is denoted by A4 for the DUT side port TP7.

In a connection B, the DUT side port TP1 is connected to the network analyzer side port NP 1. The DUT side port TP3 is connected to the network analyzer side port NP2. The DUT side port TP5 is connected to the network analyzer side port NP3. The DUT side port TP8 is connected to the network, analyzer side port NP4.

This connection is denoted by B1 for the DUT side port TP1. This connection is denoted by B2 for the DUT side port TP3. This connection is denoted by B3 for the DUT side port TP5 This connection is denoted by B8 for the DUT side port TP7.

In a connection C, the DUT side port TP2 is connected to the network analyzer side port NP1. The DUT side port TP3 is connected to the network analyzer side port NP2. The DUT side port TP6 is connected to the network analyzer side port NP3. The DUT side port TP9 is connected to the network analyzer side port NP4.

This connection is denoted by C1 for the DUT side port TP2. This connection is denoted by C2 for the DUT side port TP3. This connection is denoted by C3 for the DUT side port TP6. This connection is denoted by C4 for the DUT side port TP9.

Figure 5:
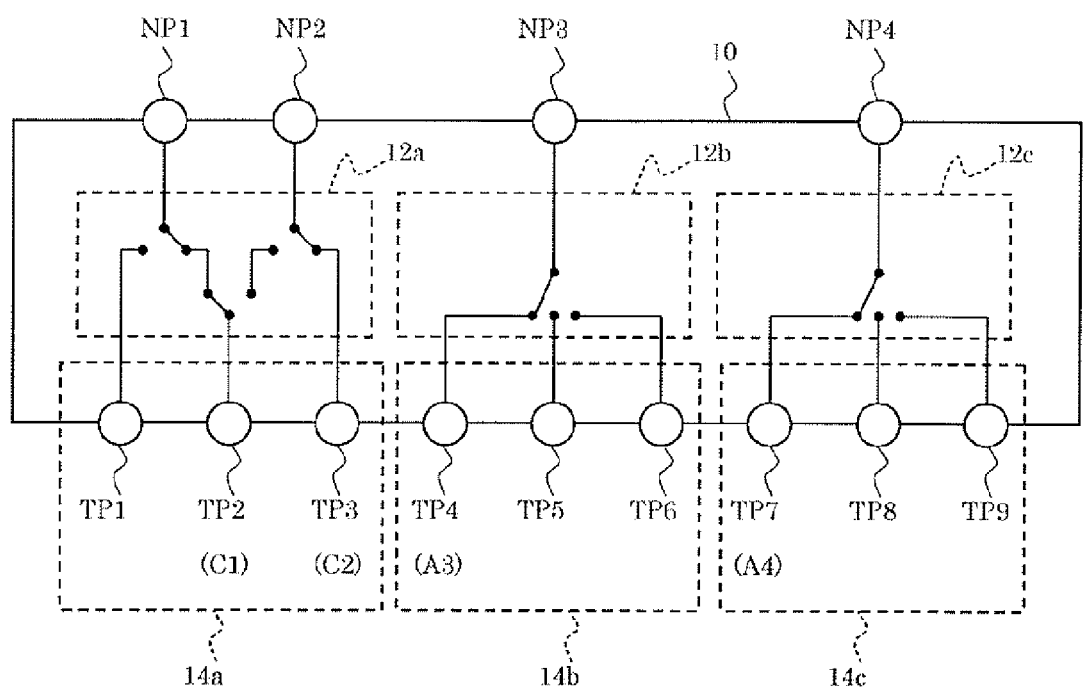
FIG. 5 shows an example of connections between the network analyzer side port and the DUT side port.

FIG. 5 shows an example of connections between the network analyzer side port and the DUT side port. In the example shown in FIG. 5, the DUT side port TP2 is connected to the network analyzer side port NP1 (C1). The DUT side port TP3 is connected to the network analyzer side port NP2 (C2). The DUT side port TP4 is connected to the network analyzer side port NP3 (A3). The DUT side port TP7 is connected to the network analyzer side port NP4 (A4).

On this occasion, the DUT side ports TP1, TP2, and TP3 are referred to as main port group 14a, the DUT side ports TP4, TP5, and TP6 are referred to as sub port group 14b, and the DUT side ports TP7, TP8, and TP9 are referred to as sub port group 14c. It is possible to independently determine the connections in the main port group 14a, the connection in the sub port group 14b, and the connection in the sub port group 14c. In the example shown in FIG. 5, though the connections in the main port group 14a are C, the connection in the sub port group 14b, and the connection in the sub port group 14c may not necessarily be C, and may be A.

Figure 6:
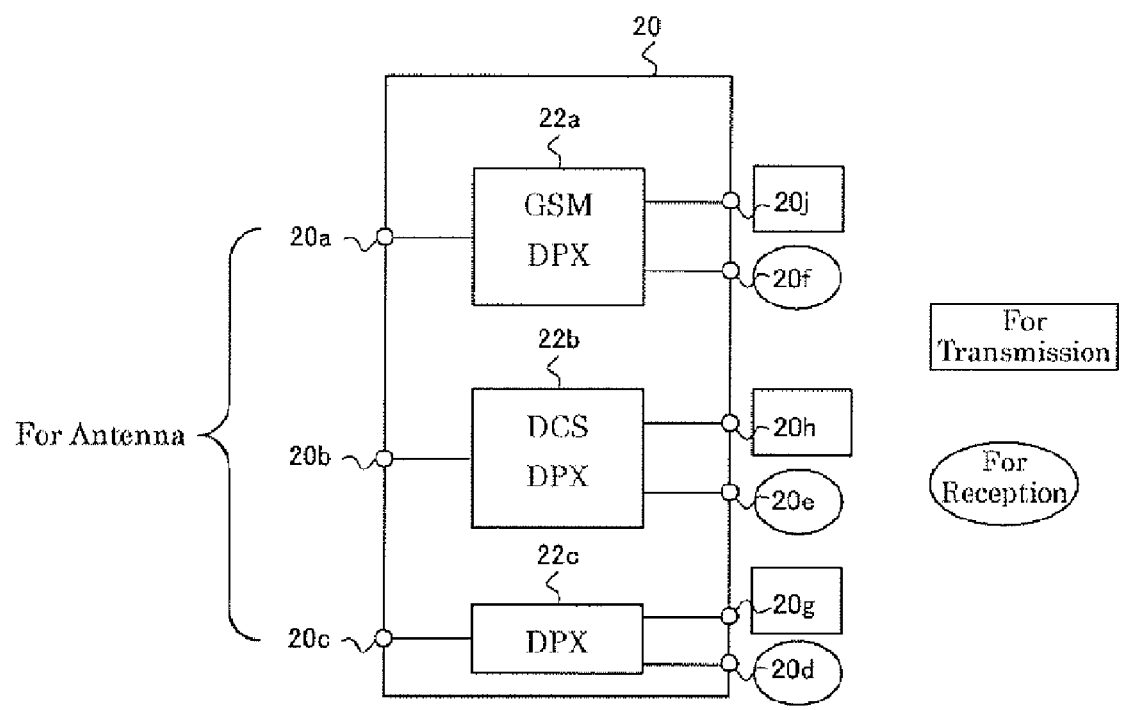
FIG. 6 is a functional block diagram showing an example of a configuration of the DUT 20.

FIG. 6 is a functional block diagram showing an example of a configuration of the DUT 20. The DUT 20 is a duplexer, for example. The DUT 20 includes a GSM duplexer (DPX) 22a, a DCS duplexer (DPX) 22b, and a duplexer (DPX) 22c.

The GSM duplexer (DPX) 22a is connected to an antenna port 20a, a transmission port 20j, and a reception port 20f. The GSM duplexer (DPX) 22a receives a signal from the antenna port 20a, and outputs the signal to the reception port 20f. Moreover, the GSM duplexer (DPX) 22a receives a signal from the transmission port 20j, and transmits the signal from the antenna port 20a.

The DCS duplexer (DPX) 22b is connected to an antenna port 20b, a transmission port 20h, and a reception port 20e. The DCS duplexer (DPX) 22b receives a signal from the antenna port 20b, and outputs the signal to the reception port 20e. Moreover the DCS duplexer (DPX) 22b receives a signal from the transmission port 20h, and transmits the signal from the antenna port 20b.

The duplexer (DPX) 22c is connected to an antenna port 20c, a transmission port 20g, and a reception port 20d. The duplexer (DPX) 22c receives a signal from the antenna port 20c, and outputs the signal to the reception port 20d. Moreover, the duplexer (DPX) 22c receives a signal from the transmission port 20g, and transmits the signal from the antenna port 20c.

In the measuring system shown in FIG. 1 are generated measuring system error factors. These measuring system error factors include Ed: error caused by the direction of a bridge, Er: error caused by frequency tracking, Es: error caused by source matching, Et: transmission tracking error, and EL. It is necessary to measure these measuring system error factors, and to remove errors of a measured result of the DUT 20. Namely, calibration is necessary.

Figure 7:
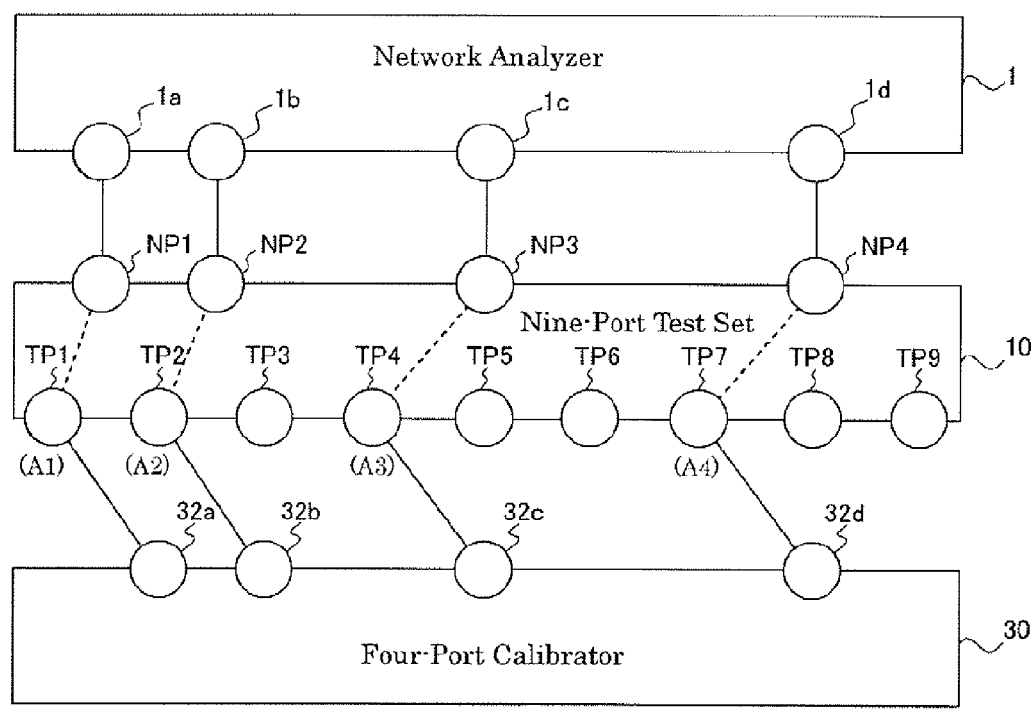
FIG. 7 shows a configuration to calibrate the measuring system.

FIG. 7 shows a configuration to calibrate the measuring system. To the nine-port test set 10 is connected a four port calibrator 30 in place of the DUT 20. It should be noted that the connections of the nine-port test set 10 are A1, A2, A3, and A4.

The four-port calibrator 30 includes calibration ports 32a, 32b, 32c, and 32d. The calibration port 32a is to be connected to the transmission/reception port 1a via the nine-port test set 10. The calibration port 32b is to be connected to the transmission/reception port 1b via the nine-port test set 10. The calibration port 32c is to be connected to the transmission/reception port 1c via the nine-port test set 10. The calibration port 32d is to be connected to the transmission/reception port 1d via the nine-port test set 10.

Since the connections of the nine-port test set 10 are A1, A2, A3, and A4, the DUT side port TP1 is connected to the calibration port 32a, the DUT side port TP2 is connected to the calibration port 32b, the DUT side port TP4 is connected to the calibration port 32c, and the DUT side port TP7 is connected to the calibration port 32d.

Figure 8:
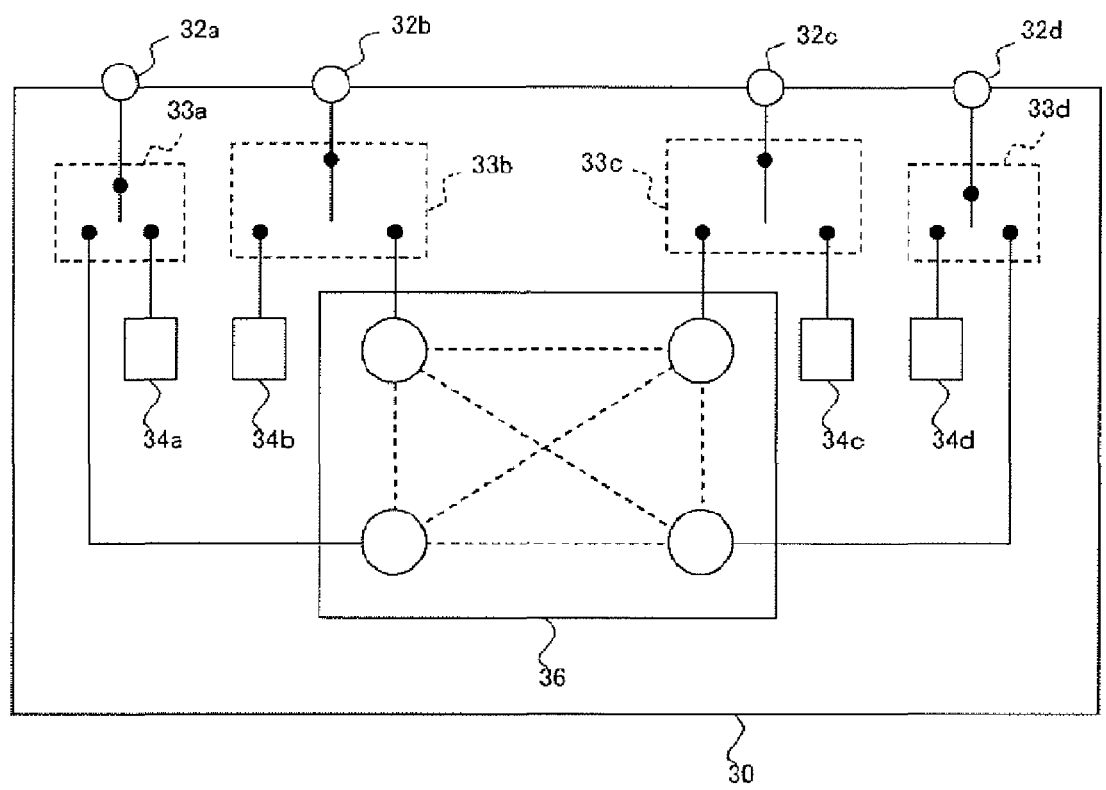

FIG. 8 is a block diagram showing a configuration of the four-port calibrator 30. The four-port calibrator 30 includes switches 33a, 33b, 33c, and 33d, sub calibrators 34a, 34b, 34c, and 34d, and a two-port coupler 36.

The switch 33a connects the calibration port 32a to the sub calibrator 34a, or the two-port coupler 36. The switch 33b connects the calibration port 32b to the sub calibrator 34b, or the two-port coupler 36. The switch 33c connects the calibration port 32c to the sub calibrator 34c, or the two-port coupler 36. The switch 33d connects the calibration port 32d to the sub calibrator 34d, or the two-port coupler 36.

Figure 9:
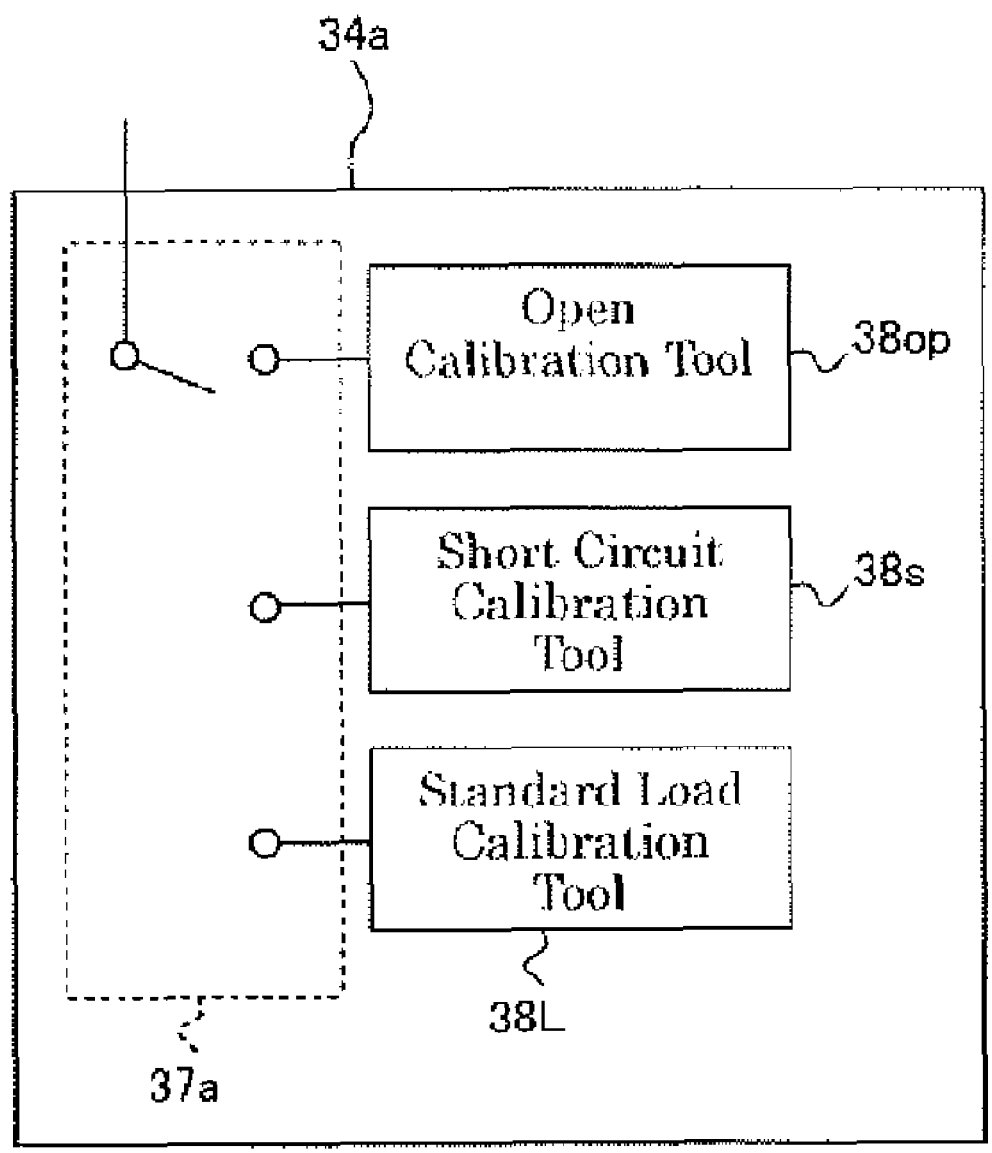

FIG. 9 is a block diagram showing a configuration of the sub calibrator 34a. The sub calibrator 34a includes an open calibration tool 38op, a short circuit calibration tool 38s, a standard load calibration tool 38L, and a calibration connecting unit 37.

The calibration tools are well-known calibration tools which realize three types of state: open, short circuit, and load (standard load Z0) as described in Japanese Laid-Open Patent Publication (Kokai) No. H11-38054.

The open calibration tool 38op realizes an open state for the transmission/reception port 1a. The short circuit calibration tool 38s realizes a short circuit state for the transmission/reception port 1a. The standard load calibration tool 38L realizes a standard load state for the transmission/reception port 1a.

The calibration tool connection unit 37 connects any one of the open calibration tool 38op, the short circuit calibration tool 38s, and the standard load calibration tool 38L to the transmission/reception port 1a. The calibration tool connecting unit 37 is a type of a switch.

It should be noted that the sub calibrators 34b, 34c, and 34d have the same configuration as that of the sub calibrator 34a. However, the sub calibrator 34b is connected to the transmission/reception port 1b. The sub calibrator 34c is connected to the transmission/reception port 1c. The sub calibrator 34d is connected to the transmission/reception port 1d.

The two-port coupler 36 is connected to the transmission/reception port 1a via the calibration port 32a and the switch 33a, to the transmission/reception port 1b via the calibration port 32b and the switch 33b, to the transmission/reception port 1e via the calibration port 32c and the switch 33c, and to the transmission/reception port 1d via the calibration port 32d and the switch 33d.

The two-port coupler 36 can realize all combinations of two ports out of the transmission/reception ports 1a, 1b, 1c, and 1d. Namely, there are six possible types of couplings: the transmission/reception ports 1a and 1b, the transmission/reception ports 1a and 1c, the transmission/reception ports 1a and 1d, the transmission/reception ports 1b and 1c, the transmission/reception ports 1b and 1d, and the transmission/reception ports 1c and 1d. The two-port coupler 36 selects and realizes these six types of couplings one by one, and finally realizes all six types.

Figure 10:
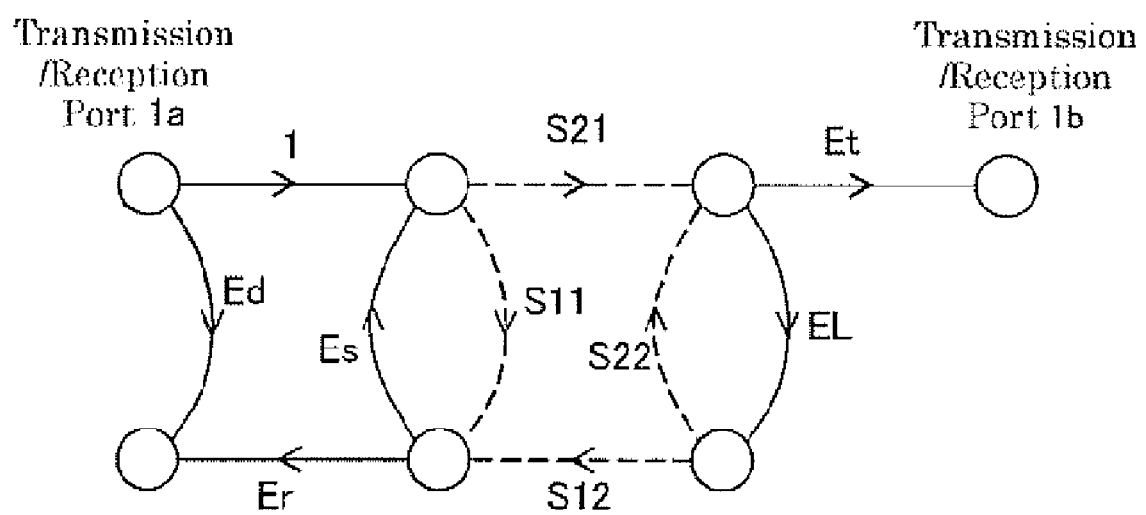
FIG. 10 is a signal flow graph showing a state where the transmission/reception port 1a and 1b are connected by the DUT 20.

FIG. 10 is a signal flow graph showing a state where the transmission/reception port 1a and 1b are connected by the DUT 20. It should be noted that S11, S12, S21, and S22 are true S parameters of the DUT 20 without a measuring system error. In the state shown in FIG. 10, a transmission signal is output from the transmission/reception port 1a, and is received by the transmission/reception port 1b. Moreover, the transmission signal output from the transmission/reception port 1a is reflected, and is received by the transmission/reception port 1a.

The measuring system error factors include Ed (error caused by the direction of a bridge), Er (error caused by frequency tracking), Es (error caused by source matching), Et (transmission tracking error), and EL. The four-port calibrator 30 is used to measure these error factors.

Figure 11:
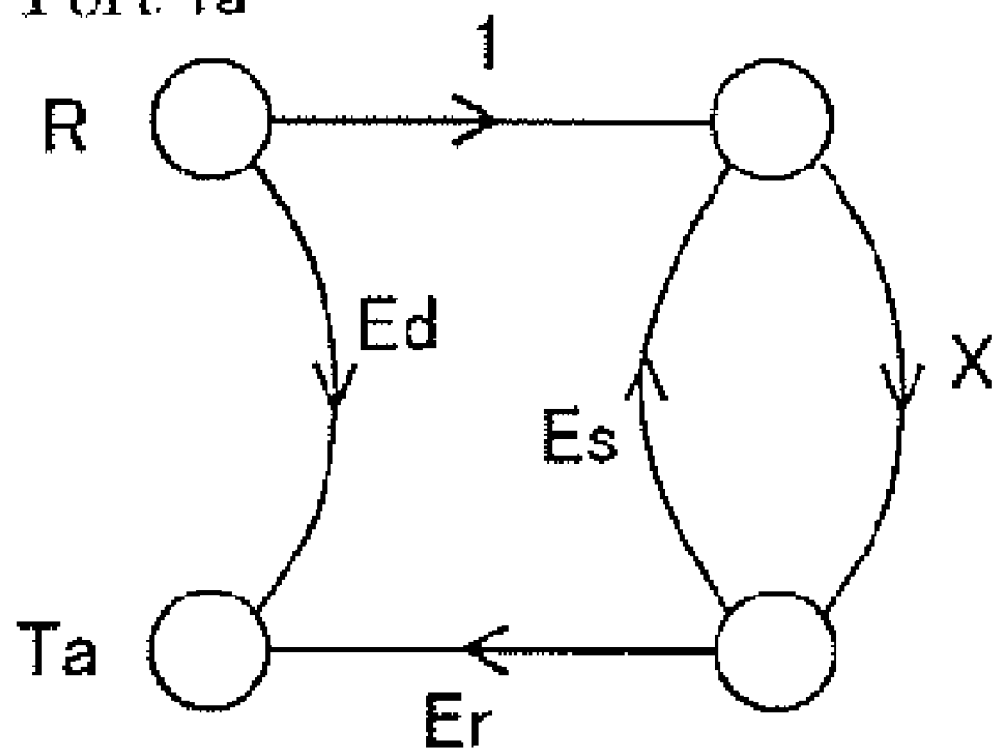

First, the switch 33a is caused to connect the calibration port 32a to the sub calibrator 34a. FIG. 11 shows this state as a signal flow graph. It should be noted that reference numeral X denotes an S parameter of the open calibration tool 38op, the short circuit calibration tool 38s, and the standard load calibration tool 38L Reference numeral R denotes an S parameter relating to a transmission signal measured by the receiver (R) 2c. Reference numeral Ta denotes an S parameter relating to a reflected signal measured by the receiver (Ta) 5a. On this occasions there holds a relationship: $Ta/R = Ed + Er \cdot X/(1 - Es \cdot X)$.

Since X takes three types of value (the S parameters of the open calibration tool 38op, the short circuit calibration tool 38s, and the standard load calibration tool 38L), Ed, Er, and Es can be acquired.

Figure 12:
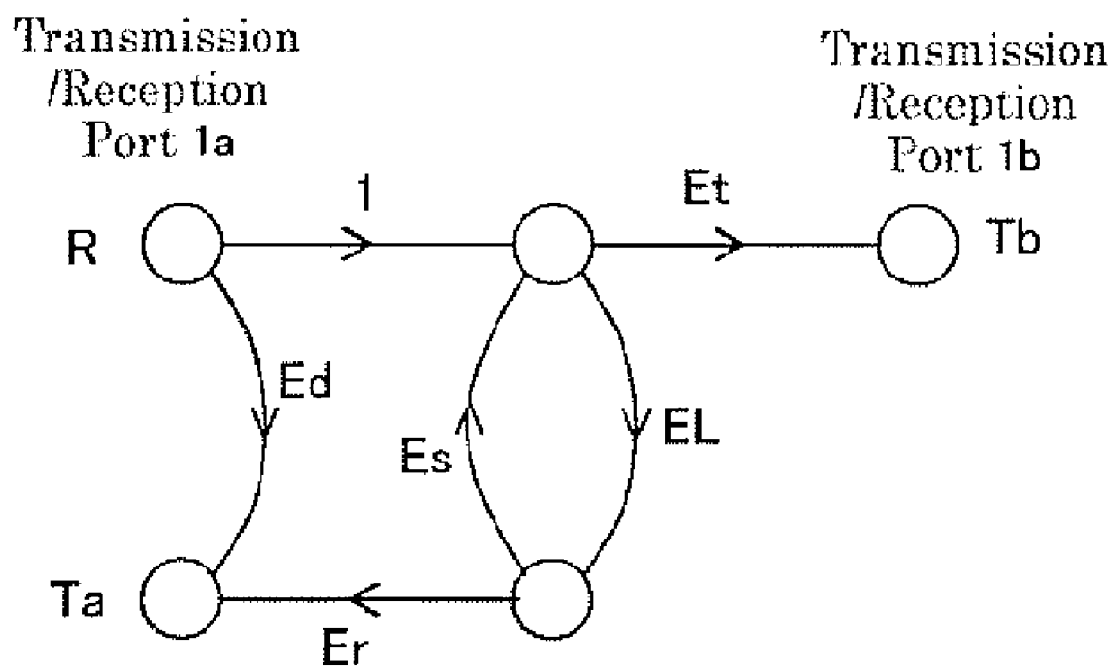
FIG. 12 is a signal flow graph showing a state where the transmission/reception ports 1a and 1b are coupled.

Then, the switch 33a is caused to connect the calibration port 32a to the two-port coupler 36. Moreover, the switch 33b is caused to connect the calibration port 32b to the two-port coupler 36. The two-port coupler 36 couples the transmission/reception ports 1a and 1b to each other by coupling the calibration port 32a and the calibration port 32b. FIG. 12 shows this state as a signal flow graph. It should be noted that reference numeral Tb denotes an S parameter relating to a reception signal measured by the receiver (Tb) 5b. On this occasion, Et can be obtained based on Tb/R. Moreover, EL can be obtained based on Ta/R.

In this way, Et (transmission tracking error) and the like can be measured. In order to determine Ft, it is necessary to couple two transmission/reception ports by means of the two port coupler 36. The coupling of the two transmission/reception ports is represented as two connections. For example in the state shown in FIG. 7, it is assumed that the transmission/reception ports 1a and 1b are coupled by the two-port coupler 36. This coupling is represented as the two connections A1 and A2.

Figure 13:
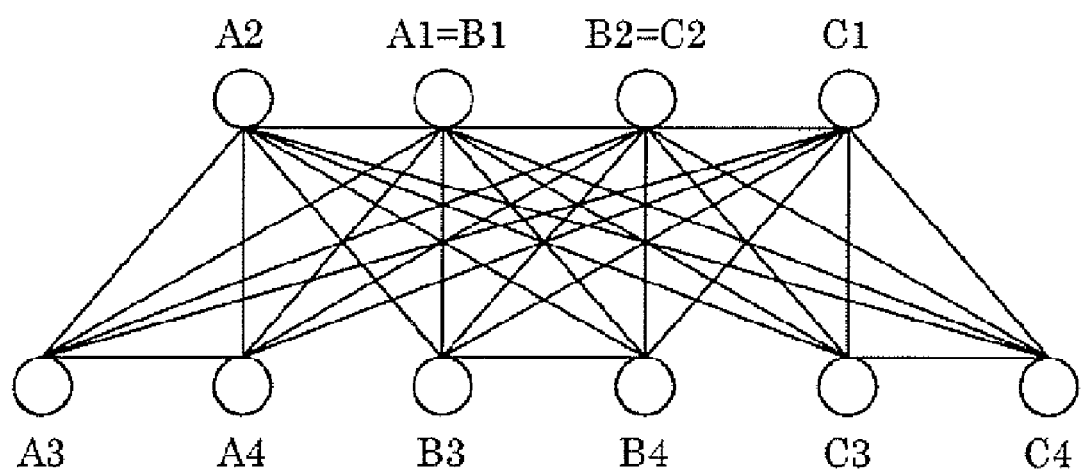
FIG. 13 shows couplings represented by connections required to determine Et (transmission tracking error) to be determined for the measuring system.

FIG. 13 shows couplings represented by connections required to determine Et (transmission tracking error) to be determined for the measuring system. In FIG. 13, notations such as A1 and A2 represent connections. It should be noted that since "A1=B1" implies that both A1 and B1 connect the DUT side port TP1 to the network analyzer side port NP1, both of them represent the same state. Moreover: since "B2=C2" implies that both B2 and C2 connect the DUT side port TP3 to the network analyzer side port NP2, both of them represent the same state. In addition, a line connecting the respective connections with each other implies connections to be coupled to measure Et (transmission tracking error). For example, it is necessary to couple the connections A1 and A2 to each other. However, it is not necessary to couple the connections A4 and B3.

FIG. 13 indicates that couplings of one of the connections A1 and A2 of the main port group 14a to all the connections A3, A4, B3, B4, C3, and C4 of the sub port groups 14b and 14c are necessary. Similarly, couplings of one of the connections B1 and B2 of the main port group 14a to all the connections A3, A4, B3, B4, C3, and C4 of the sub port groups 14b and 14c are necessary. Similarly, couplings of one of the connections C1 and C2 of the main port group 14a to all the connections A3, A4, B3, B4, C3, and C4 of the sub port groups 14b and 14c are necessary.

If all the couplings shown in FIG. 13 are to be realized by the two-port coupler 36 of the four-port calibrator 30, it is necessary to repeat attachment/detachment of the four-port calibrator 30 to/from the nine-port test set 10 seven times. It should be noted that since the network analyzer 1 according to the embodiment of the present invention includes the transmission tracking error deriving unit 8, the attachment/detachment is actually necessary three times as described later.

Figure 14:
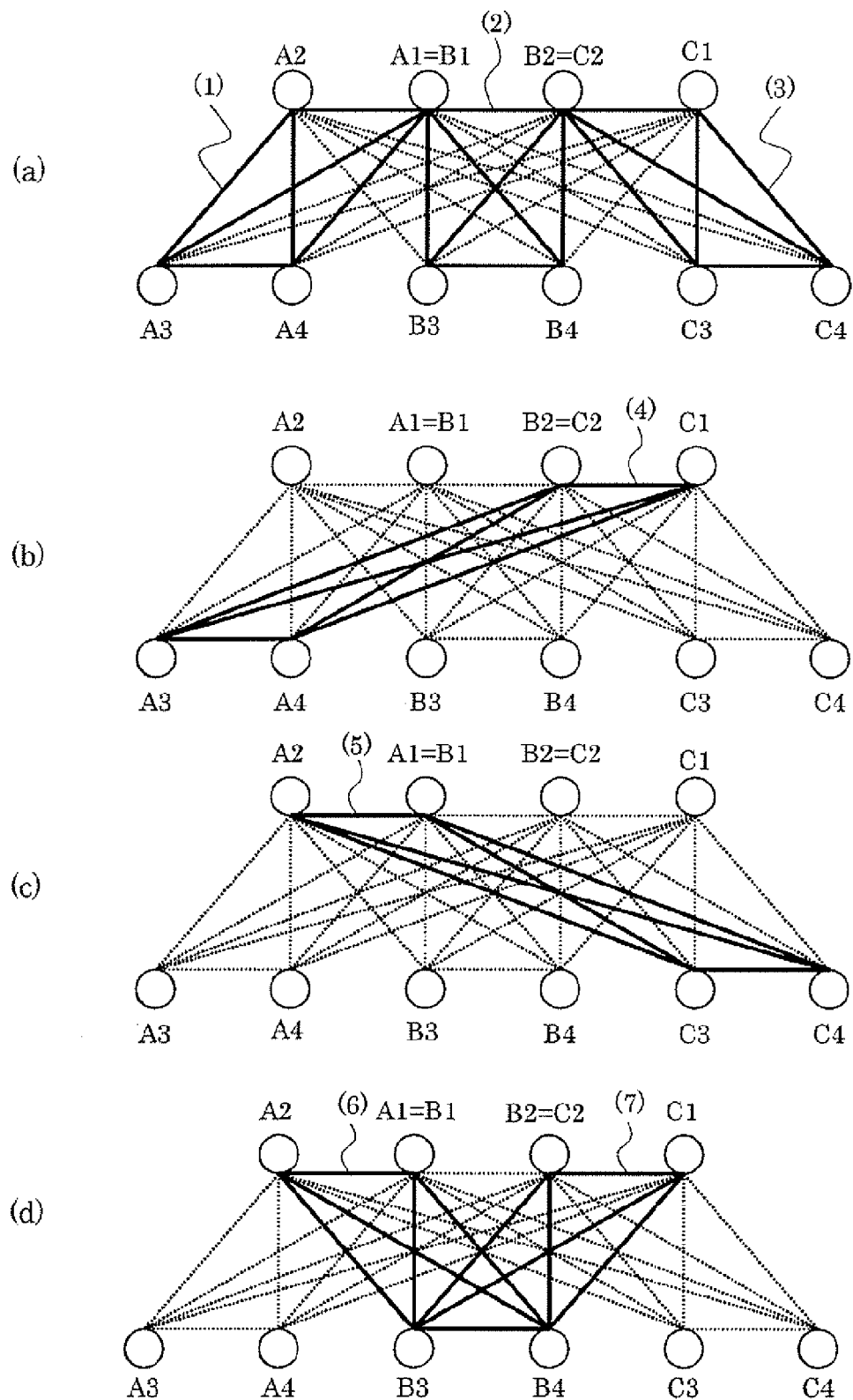
FIG. 14 shows how the four-port calibrator 30 is attached to/detached from the nine-port test set 10 (if the transmission tracking deriving unit 8 is not available)

FIG. 14 shows how the four-port calibrator 30 is attached to/detached from the nine-port test set 10 (f the transmission tracking deriving unit S is not available). The sequence of the attachment/detachment is not limited to the one shown in FIG. 14.

First, as shown in FIG. 14(a), the four-port calibrator 30 is attached to the nine-port test set 10, and (1) the connections A1, A2, A3, and A4 are coupled. Namely, there are sequentially realized a coupling of the connections A1 and A2, a coupling of the connections A1 and A3, a coupling of the connections A1 and A4, a coupling of connections A2 and A3, a coupling of the connections A2 and A4, and a coupling of the connections A3 and A4. Then, the four-port calibrator 30 is detached from and attached again to the nine-port test set 10, and (2) the connections B1, B2, B3, and B4 are coupled. Further, the four-port calibrator 30 is detached from and attached again to the nine-port test set 10, and (3) the connections C1, C2, C3, and C4 are coupled.

Further, as shown in FIG. 14(b), the four-port calibrator 30 is detached from, and attached again to the nine-port test set 10, and (4) the connections C1, C2, A3, and A4 are coupled. Then, the four-port calibrator 30 is detached from, and attached again to the nine-port test set 10, and, as shown in FIG. 14(c), (5) the connections A1, A2, C3, and C4 are coupled. Finally, the four-port calibrator 30 is detached from, and attached again to the nine-port test set 10, (6) the connections A1, A2, B3, and B4 are coupled as shown in FIG. 14(d), the four-port calibrator 30 is detached from, and attached again to the nine-port test set 10, and (7) the connections C1, C2, B3, and B4 are coupled.

Figure 15:
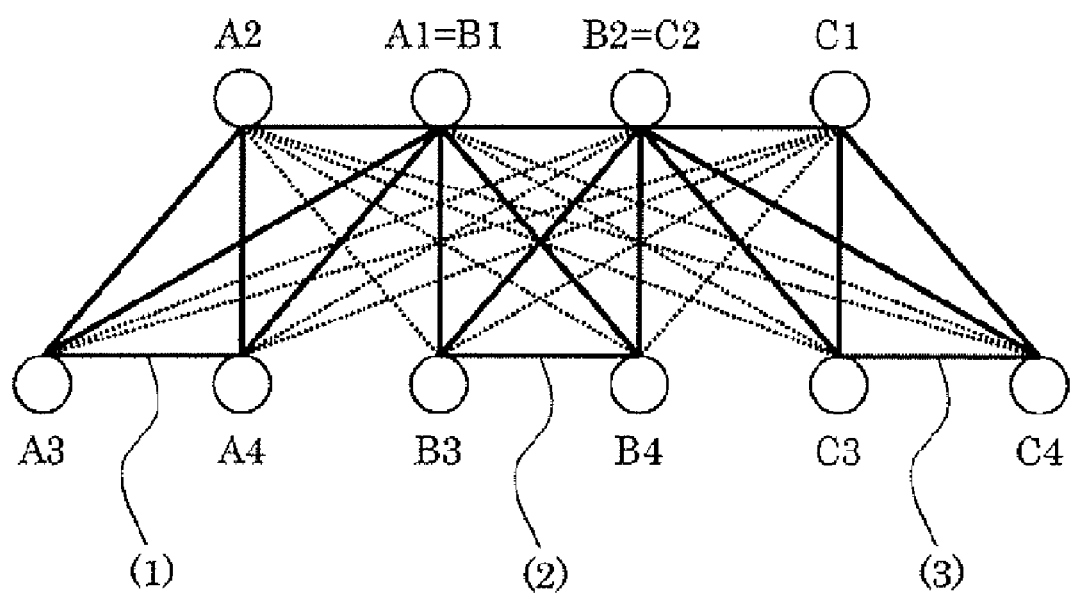
FIG. 15 shows a form of attachment/detachment of the four-port calibrator 30 to/from the nine-port test set 10.

However, since the network analyzer 1 according to the embodiment of the present invention includes the transmission tracking error deriving unit 8, as shown in FIG. 15, there are necessary only three types of the connections; the couplings of (1) the connections A1, A2, A3, and A4, the couplings of (2) the connections B1, B2, B3, and B4, and the couplings of (3) the connections C1, C2, C3, and C4. Et (transmission tracking errors) relating to the other couplings (indicated by dotted lines) can be derived from Et (transmission tracking errors) relating to the couplings (1), (2), and (3).

Figure 16:
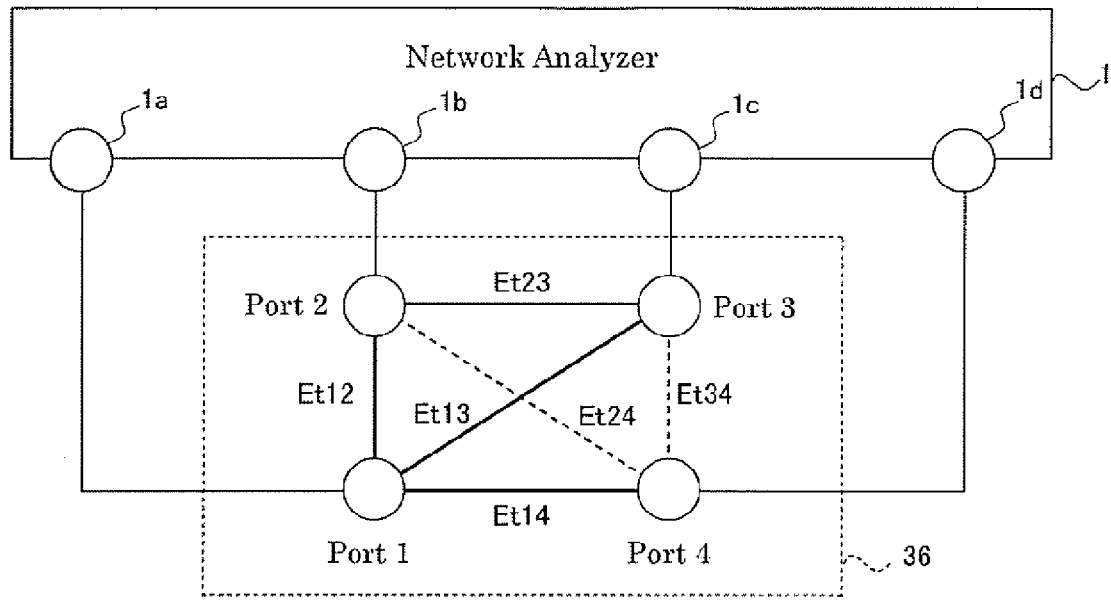
FIG. 16 is a diagram describing a principle of how to derive Et (transmission tracking error)
Figure 16:
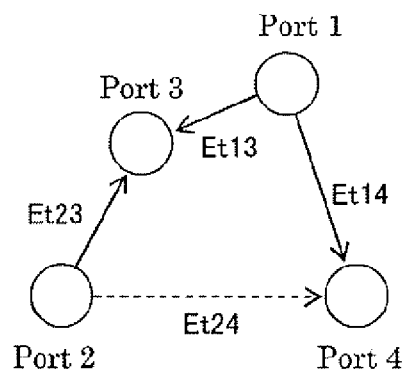

FIG. 16 describes a principle of how to derive Et (transmission tracking errors). For the sake of description, as shown in FIG. 16(a), the network analyzer 1 is directly connected to the two-port coupler 36. It is assumed that the transmission/reception port 1a is connected to a port 1 of the two-port coupler 36, the transmission/reception port 1b is connected to a port 2 of the two-port coupler 36, the transmission/reception port 1c is connected to a port 3 of the two-port coupler 36, and the transmission/reception port 1d is connected to a port 4 of the two-port coupler 36.

With reference to FIG. 16(a), a transmission tracking error Et12 can be measured by connecting the port 1 and the port 2. It should be noted that Etij denotes a transmission tracking error when a signal is transmitted from a transmission/reception port connected to a port i, and is received by a transmission/reception port connected to a port j. Moreover, a transmission tracking error Et13 can be measured by connecting the port 1 and the port 3. A transmission tracking error Et23 can be measured by connecting the port 2 and the port 3. A transmission tracking error Et14 can be measured by connecting the port 1 and the port 4.

On this occasion, Et24 can be derived without connecting the port 2 and the port 4. Et34 can also be derived without connecting the port 3 and the port 4. This is based on a theorem: Etik/Etjk=constant regardless of k. It should be noted that i≠j, k≠i, and k≠j. For example, Et24/Et14=Et23/Et13. Since Et14, Et23, and Et13 have already been measured, Et24 can be derived.

FIG. 16(b) shows how to derive Et24. Et24 is represented as an arrow proceeding from the port 2 to the port 4. To proceed from the port 2 to the port 4, a route from the port 2 to the port 3 may be taken (Et23), a route from the port 3 to port 1 may be taken (inverse of Et13), and a route from the port 1 to port 4 may be taken (Et14). This corresponds to the fact that Et24 can be derived from Et14, Et23, and Et13. Namely, Et24, which is represented as an arrow proceeding from the port 2 to port 4, can be obtained by means of other three arrows which proceed from the port 2 to the port 4 (the arrow proceeding from the port 2 to the port 3, the arrow proceeding from the port 1 to the port 3 (inverse direction), and the arrow proceeding from the port 1 to the port 4).

With reference to FIG. 15, for example, it is appreciated that Et (transmission tracking error) for the coupling of the connection M and the connection B3 can be derived by means of the method described with reference to FIG. 16 from Et for the coupling of the connection A2 and the connection A1, Et for the coupling of the connection B1 (=A1) and the connection B2, and Et for the coupling of the connection B2 and the connection B3. In this way, it is appreciated that Et can be derived by means of the two connections A1 and B2 other than the connection A2 and the connection B3, which are respectively a start point and an end point of Et.

Moreover, it is appreciated that Et (transmission tracking error) for the coupling of the connection 42 and the connection C3 can be derived from Ft for the coupling of the connection A2 and the connection A1, Et for the coupling of the connection B1 (=A1) and the connection B2, and Et for the coupling of the connection C2 (=B2) and the connection C3. In this way, it is appreciated that Et can be derived by means of the two connections B1 and C2 other than the connection A2 and the connection C3, which are respectively a start point and an end point of Et.

The transmission tracking error determining unit 7 of the network analyzer 1 determines Et (transmission tracking errors) relating to the couplings (1), (2), and (3). For which coupling a measured result is obtained is determined by connections provided by the nine-port test set connection acquiring unit 6.

The transmission tracking error deriving unit 8 uses the above-described deriving method to derive Et which have not been determined based on Et relating to the couplings (1), (2), and (3) determined by the transmission tracking error determining unit 7.

Figure 17:
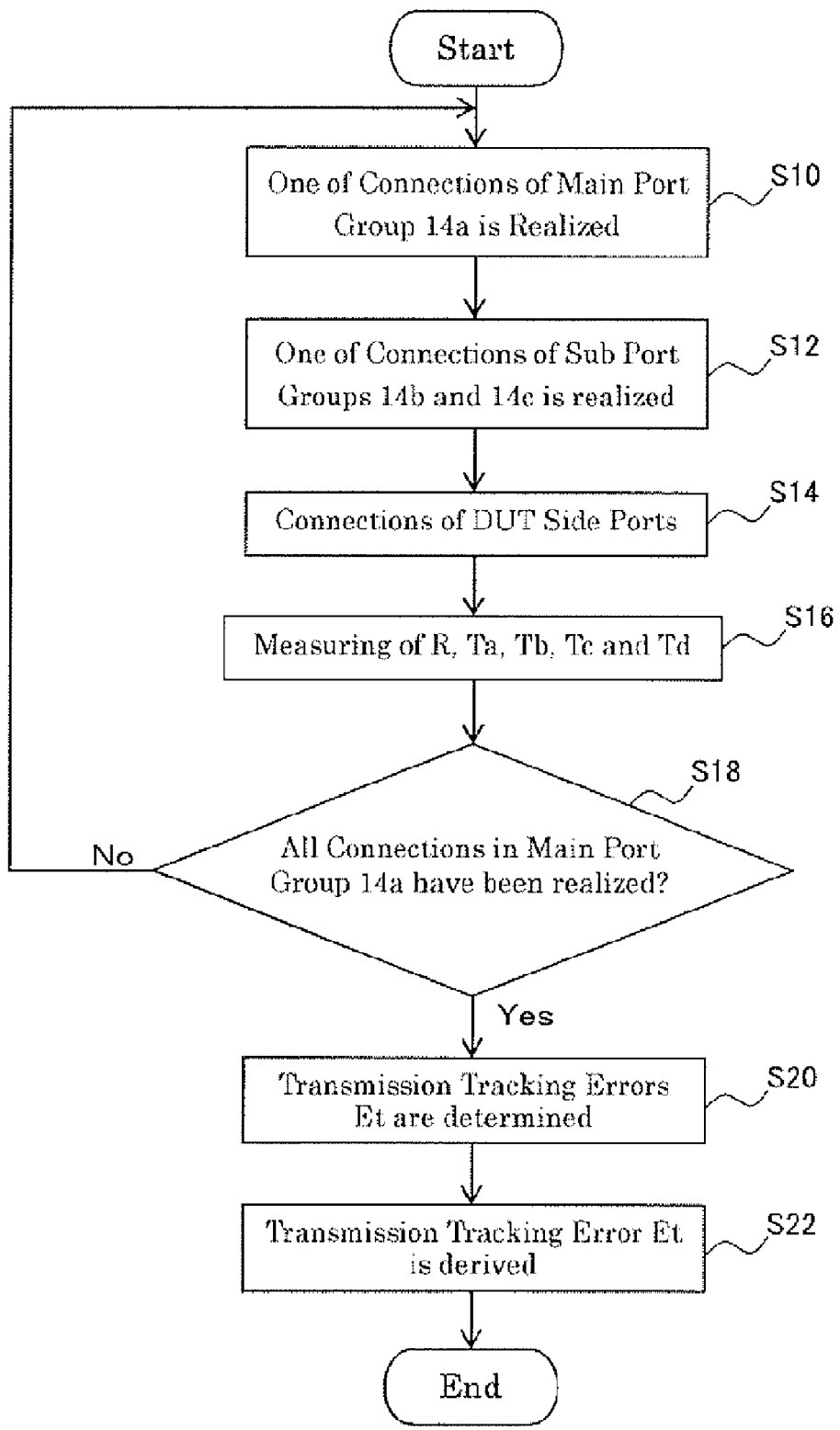
FIG. 17 is a flowchart showing an operation of the embodiment of the present invention.
Figure 18:
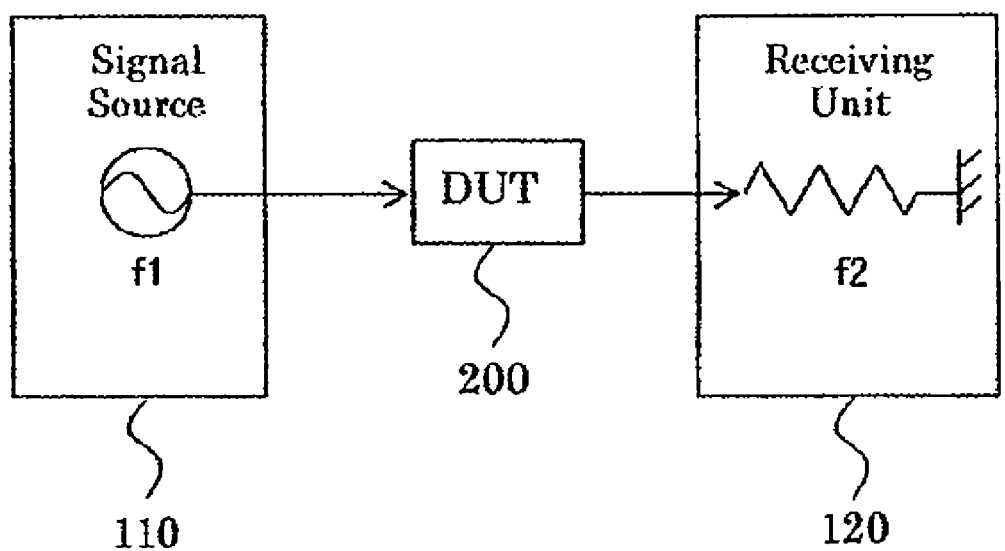
FIG. 18 is a diagram describing a measurement method of the circuit parameters of the device under test (DUT) according to the prior art.
Figure 19:
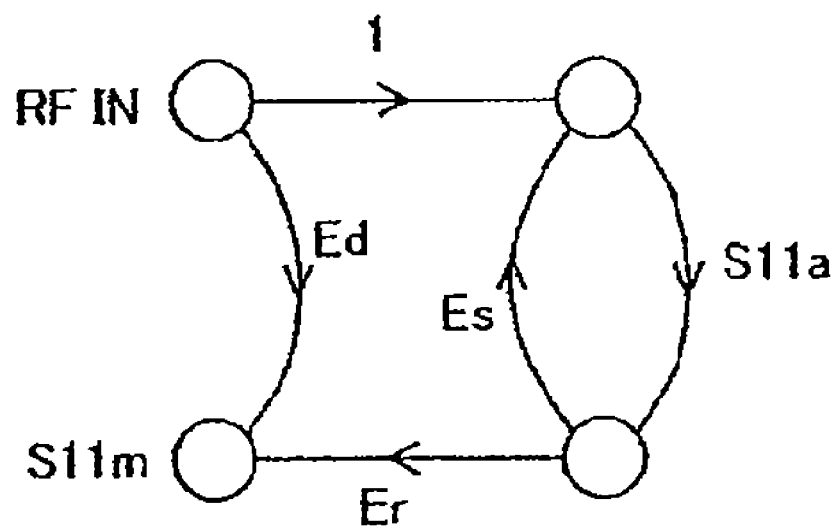
FIG. 19 shows a signal flow graph relating to the signal source 110 if the frequency f1=f2.
Figure 20:
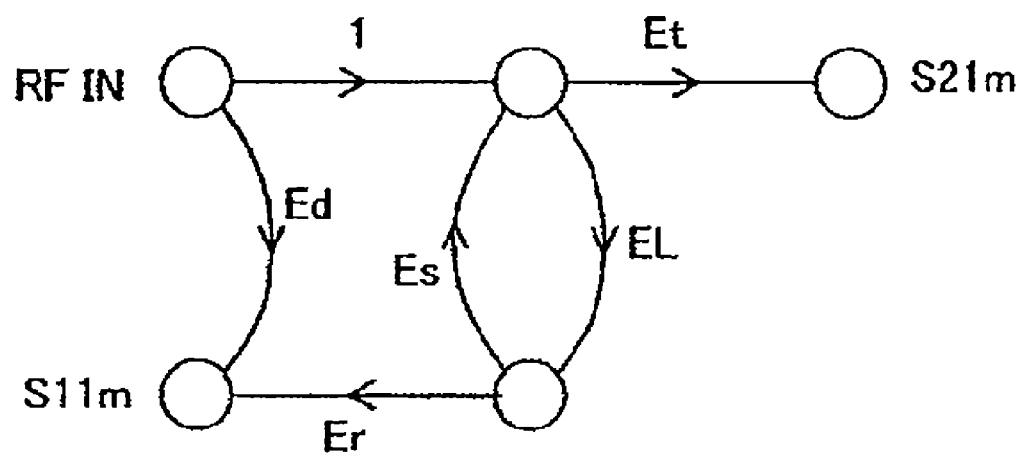
FIG. 20 shows a signal flow graph if the signal source 110 and the receiving unit 120 are directly connected with each other.

A description will now be given of an operation of the embodiment of the present invention with reference to a flowchart in FIG. 17.

First, one of the connections of the main port group 14*a* is realized by operating the port connecting units 12*a*, 12*b*, and 12*c* of the nine-port test set 10 (S10). The connections in the main port group 14*a* includes the three types: A1 and A2, B1 and B2, and C1 and C2. One of them such as A1 and A2 is realized.

Then, one of the connections of the sub port groups 14*b* and 14*c* is realized by operating the port connecting units 12*a*, 12*b*, and 12*c* of the nine-port test set 10 (S12). The connections of the sub port groups 14*b* and 14*c* include the three types: A3 and A4, B3 and B4, and C3 and C4. One of them such as A3 and A4 is realized.

Then, the four-port calibrator 30 is connected to the DUT side ports of the nine-port test set 10 (S14). If A1 and A2, and A3 and A4 are realized, the DUT side port TP1 is connected to the calibration port 32*a*; the DUT side port TP2 is connected to the calibration port 32*b*; the DUT side port TP4 is connected to the calibration port 32*c*; and the DUT side port TP7 is connected to the calibration port 32*d*. Namely, the DUT side ports respectively connected to the network analyzer side ports NP1, NP2, NP3, and NP4 are connected to the calibration ports 32*a*, 32*b*, 32*c*, and 32*d*.

The network analyzer 1 then transmits a signal. Then, there are measured R (transmission signal parameter), Ta, Tb, Tc, and Td (reception signal parameters) (S16). The operation of the four-port calibrator 30 is as described above when the R, Ta, Tb, Tc, and Td are measured. The combinations of the two ports of the DUT side ports connected to the calibration ports 32*a*, 32*b*, 32*c*, and 32*d* (also connected to the network analyzer side ports) are realized one by one, and finally all the six types are realized.

On this occasion, it is determined whether all the connections in the main port group 14*a* have been realized (S18). If there axe connections which have not been realized ("NO" to S18), the operation returns to the step to realize one of the connections in the main port group 14*a* (S10). Consequently, R, Ta, Tb, Tc, and Td are measured for the following couplings of the connections.

First, one of the connections of the main port group 14*a*, A1 and A2, is realized (S10), and the one of the connections of the sub port groups 14*b* and 14*c*, A3 and A4, is realized (S12). As a result, R, Ta, Tb, Tc, and Td are measured for the couplings of (1) the connections A1, A2, A3, and A4 (refer to FIG. 15) (S16).

Then, one of the connections of the main port group 14*a*, B1 and B2, is realized (S10), and the one of the connections of the sub port groups 14*b* and 14*c*, B3 and B4, is realized (S12). As a result, R, Ta, Tb, Tc, and Td are measured for the couplings of (2) the connections B1, B2, B3, and B4 (refer to FIG. 15) (S16).

Finally, one of the connections of the main port group 14*a*, C1 and C2, is realized (S10), and the one of the connections of the sub port groups 14*b* and 14*c*, C3 and C4, is realized (S12) As a result, R, Ta, Tb, Tc, and Td are measured for the couplings of (3) the connections C1, C2, C3, and 64 (refer to FIG. 15) (S16).

Up to this state, all the connections (the three types: A1 and A2, B1 and 132, and C1 and C2) in the main port group 14*a* have been realized ("YES" to the step S18).

If all the connections in the main port group 14*a* have been realized ("YES" to S18), the transmission tracking error determining unit 7 determines Et (transmission tracking errors) based on the measured result of the R, Ta, Tb, Tc, and Td, and the connections acquired by the nine-port test set connection acquiring unit 6 (S20).

The transmission tracking error deriving unit 8 uses the above-described deriving method to derive Et which have not been determined based on Et relating to the couplings (1), (2), and (3) determined by the transmission tracking error determining unit 7 (S22).

According to the embodiment of the present invention, the transmission tracking error determining unit 7 can determine Et (transmission tracking errors) for couplings of one of the connections of the main port group 14*a* (such as A1 and A2), and one of the connections of the sub port groups 14*b* and 14*c* (such as A3 and A4).

Moreover the measurement of Et (transmission tracking errors) is carried out for all the possible connections (the three types: A1 and A2, B1 and B2, and C1 and C2) in the main port group 14*a*. For example, with reference to FIG. 15, Et (transmission tracking errors) are measured for (1) the combination of A1 and A2, and A3 and A4, (2) the combination of B1 and B2, and B3 and B4, and (3) the combination of C1 and C2, and C3 and C4.

Based on these measured Et (transmission tracking errors), the transmission tracking error deriving unit 8 derives the Et which are not measured For example, Et (transmission tracking error) of the coupling of the connection A1 and the connection B3 are derived by the two connections A1 and B2 other than the connection A1 and the connection B3, which are respectively the start point and the end point of Et.

It is necessary to attach/detach the four-port calibrator 30 to/from the nine-port test set 10 only three times to measure and derive Et (transmission tracking errors) in this way. The number of the attachment/detachment can be reduced compared with the seven times of them (refer to FIG. 14) if the transmission tracking error deriving unit 8 does not derive Et (transmission tracking errors).

The attachment/detachment of the four-port calibrator 30 to/from the nine-port test set 10 is carried out in order to directly connect two ports selected from the transmission/reception ports 1*a*, 1*b*, 1*c*, and 1*d* of the network analyzer 1. Since the number of the attachment/detachment of the four-port calibrator 30 to/from the nine-port test set 10 is reduced, the labor to directly connect the two ports selected from the transmission/reception ports 1*a*, 1*b*, 1*c*, and 1*d* of the network analyzer 1 is also reduced.

Moreover, the above-described embodiment may be realized in the following manner. A computer is provided with a CPU, a hard disk, and a media (such as a floppy disk (registered trade mark) and a CD-ROM) reader, and the media reader is caused to read a medium recording a program realizing the above-described respective components (such as the nine-port test set connection acquiring unit 6, the transmission tracking error determining unit 7, and the transmission tracking error deriving unit 8), thereby installing the program on the hard disk. This method may also realize the above-described embodiment.

The invention claimed is:

1. A network analyzer that is connected to a test set that comprises network analyzer side ports, device under test side ports that are connected to a device under test, and a port connecter that selects any one of the device under test side ports, and connects the selected device under test side port to one of the network analyzer side ports, wherein the device under test side ports constitute a main port group and a sub port group whose connection to the network analyzer side ports is independently set, the network analyzer comprising:
  transmission and reception ports that are connected to the network analyzer side ports one by one, and are used to transmit and receive a signal;
  a transmission tracking error determiner that determines a transmission tracking error of a combination of one of the possible connections of the main port group and one of the possible connections of the sub port group for all the possible connections of the main port group based on a signal prior to transmission by said transmission and reception port, and a reception signal; and
  a transmission tracking error deriver that derives a transmission tracking error other than the transmission tracking errors determined by said transmission tracking error determiner based on the transmission tracking error determined by said transmission tracking error determiner.

2. The network analyzer according to claim 1,
wherein said transmission tracking error deriver uses two connections other than connections at a start point and an endpoint of the transmission tracking error to be derived to derive the transmission tracking error for a combination of one of the possible connections of the main port group and another possible connection of the sub port group.

3. The network analyzer according to claim 2, wherein:
the main port group includes three of the device under test side ports connected to two of the network analyzer side ports;
the sub port group includes three of the device under test side ports connected to one of the network analyzer side ports; and
two of the sub port groups exist.

4. The network analyzer according to claim 2, further comprising:
  a transmission signal measurer that measures a transmission signal parameter relating to a transmission signal transmitted from said transmission and reception port before a measuring system error factor is generated; and
  a reception signal measurer that measures a reception signal parameter relating to a reception signal received by said transmission and reception port.

5. The network analyzer according to claim 4, wherein the reception signal includes a reflected signal which is a reflected transmission signal.

6. The network analyzer according to claim 1, wherein:
the main port group includes three of the device under test side ports connected to two of the network analyzer side ports;
the sub port group includes three of the device under test side ports connected to one of the network analyzer side ports; and
two of the sub port groups exist.

7. The network analyzer according to claim 1, further comprising:
  a transmission signal measurer that measures a transmission signal parameter relating to a transmission signal transmitted from said transmission and reception port before a measuring system error factor is generated; and
  a reception signal measurer that measures a reception signal parameter relating to a reception signal received by said transmission and reception port.

8. The network analyzer according to claim 7,
wherein the reception signal includes a reflected signal which is a reflected transmission signal.

9. A transmission tracking error measuring method of measuring a transmission tracking error of a network analyzer that is connected to a test set that comprises network analyzer side ports, device under test side ports that are connected to a device under test, and a port connecter that selects any one of the device under test side ports, and connects the selected device under test side port to one of the network analyzer side ports, wherein the device under test side ports constitute a main port group and a sub port group whose connection to the network analyzer side ports is independently set, the network analyzer comprising transmission and reception ports that are connected to the network analyzer side ports one by one, and are used to transmit/receive a signal, the transmission tracking error measuring method comprising:
  realizing, in a connection operation, a combination of one of the possible connections of the main port group and one of the possible connections of the sub port group for all the possible connections of the main port group;
  realizing all couplings for one combination of two ports for the device under test side ports connected to the network analyzer side ports if the combination is realized by said connection operation;
  measuring a signal prior to being transmitted by transmission and reception port, and a resulting signal after said signal has been transmitted;
  determining a transmission tracking error of the coupling realized by said device under test side port coupling realizing based on a measured result of said signal measuring; and
  deriving a transmission tracking error other than the transmission tracking error determined by said transmission tracking error determining based on the transmission tracking error determined by said transmission tracking error determining.

10. The transmission tracking error measuring method according to claim 9,
wherein said device under test side port coupling realizing is realized by a four-port calibrator which can couple all combinations of two ports out of four ports.

11. A network analyzing method of analyzing the network by using a network analyzer that is connected to a test set that comprises network analyzer side ports, device under test side ports that are connected to a device under test, and a port connecter that selects any one of the device under test side ports, and connects the selected device under test side port to one of the network analyzer side ports, wherein the device under test side ports constitute a main port group and a sub port group whose connection to the network analyzer side ports is independently set, the network analyzer comprising: transmission and reception ports that are connected to the network analyzer side ports one by one, and are used to transmit/receive a signal; the network analyzing method comprising:
  determining a transmission tracking error of a combination of one of the possible connections of the main port group and one of the possible connections of the sub port group for all the possible connections of the main port group based on a signal before transmitted by said transmission and reception port, and a reception signal; and
  deriving a transmission tracking error other than the transmission tracking errors determined by said transmission tracking error determining based on the transmission tracking error determined by said transmission tracking error determining.

12. A computer-readable medium having a program of instructions for execution by the computer to perform a processing for analyzing a network by using a network analyzer that is connected to a test set that comprises network analyzer side ports, device under test side ports that are connected to a device under test, and a port connecter that selects any one of the device under test side ports, and connects the selected device under test side port to one of the network analyzer side ports, wherein the device under test side ports constitute a main port group and a sub port group whose connection to the network analyzer side ports is independently set, the network analyzer comprising: transmission and reception ports that are connected to the network analyzer side ports one by one, and are used to transmit and receive a signal; said processing comprising:

determining a transmission tracking error of a combination of one of the possible connections of the main port group and one of the possible connections of the sub port group for all the possible connections of the main port group based on a signal before transmitted by said transmission and reception port, and a reception signal; and deriving a transmission tracking error other than the transmission tracking errors determined by said transmission tracking error determining based on the transmission tracking error determined by said transmission tracking error determining.

* * * * *

UNITED STATES PATENT AND TRADEMARK OFFICE
CERTIFICATE OF CORRECTION

PATENT NO. : 7,519,509 B2 Page 1 of 1
APPLICATION NO. : 10/599124
DATED : April 14, 2009
INVENTOR(S) : Yoshikazu Nakayama et al.

It is certified that error appears in the above-identified patent and that said Letters Patent is hereby corrected as shown below:

At column 18, line 26 (claim 9, line 23), insert --a-- after "by"

Signed and Sealed this

Twenty-seventh Day of October, 2009

David J. Kappos
*Director of the United States Patent and Trademark Office*